US006472924B1

(12) United States Patent
Takenaka

(10) Patent No.: US 6,472,924 B1
(45) Date of Patent: Oct. 29, 2002

(54) INTEGRATED SEMICONDUCTOR CIRCUIT HAVING ANALOG AND LOGIC CIRCUITS

(75) Inventor: Tetsuro Takenaka, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/283,178

(22) Filed: Apr. 1, 1999

(30) Foreign Application Priority Data

Feb. 2, 1999 (JP) .......................................... 11-025092

(51) Int. Cl.[7] .................................................. H03L 5/00

(52) U.S. Cl. ......................... 327/333; 327/437; 327/81; 326/36

(58) Field of Search ................................ 327/333, 437, 327/306, 80, 354, 537, 81; 326/36, 35

(56) References Cited

U.S. PATENT DOCUMENTS

| | | | | | |
|---|---|---|---|---|---|
| 5,237,212 | A | * | 8/1993 | Maekawa | 327/333 |
| 5,483,176 | A | | 1/1996 | Rodriquez et al. | 326/21 |
| 5,559,996 | A | * | 9/1996 | Fujioka | 327/333 |
| 5,982,206 | A | * | 11/1999 | Maekawa | 327/437 |
| 5,986,309 | A | | 11/1999 | Fujimoto et al. | 257/368 |
| 5,994,741 | A | | 11/1999 | Koizumi et al. | 257/355 |
| 6,043,679 | A | | 3/2000 | Kwon | 326/68 |

FOREIGN PATENT DOCUMENTS

| | | |
|---|---|---|
| JP | 61-64148 | 4/1986 |
| JP | 62-178013 | 8/1987 |
| JP | 2-350 | 1/1990 |
| JP | 4-352467 | 12/1992 |
| JP | 6-163823 | 6/1994 |
| JP | 7-099236 | 4/1995 |
| JP | 7-240471 | 9/1995 |
| JP | 52-142974 | 11/1997 |

* cited by examiner

*Primary Examiner*—Dinh T. Le
(74) *Attorney, Agent, or Firm*—Jones Volentine, PLLC

(57) ABSTRACT

In a semiconductor integral circuit having a transistor or an inverter, a leak current of the transistor or a through current of the inverter, respectively, or the like is reduced. The semiconductor integral circuit has an analog circuit which changes linearly the voltage of an input signal and causes the amount of a current flowing through the analog circuit to change in accordance with the change in the voltage of the input signal. The semiconductor integral circuit also has a logic circuit to which an input signal having a first or second voltage is input. This logic circuit outputs an output signal having the first or second voltage in response to the first or second voltage of the input signal. The absolute value of the threshold value of the MOS transistor of the analog circuit is set smaller than the absolute value of the threshold value of the MOS transistor of the logic circuit.

8 Claims, 5 Drawing Sheets

INTEGRATED SEMICONDUCTOR CIRCUIT HAVING ANALOG AND LOGIC CIRCUITS

BACKGROUND OF THE INVENTION

1. Field of the Invention

The present invention relates to a semiconductor integral circuit that operates with a low voltage.

2. Description of Related Art

In recent years, semiconductor integral circuits that operate with a low voltage are being developed. In this type of circuit, the threshold values of P channel type MOS transistors (PMOS hereafter) and N channel type MOS transistors (NMOS hereafter), which constitute the semiconductor integral circuits, are adjusted so as to achieve low voltage operation.

In other words, the threshold value of each of the PMOS transistors that constitutes a semiconductor integral circuit that operates with a low voltage is set higher than the threshold value of PMOS transistors that constitutes a semiconductor integral circuit that operates with a high voltage. In the case of a PMOS transistor, the threshold value is negative. Therefore, the absolute value of the threshold value of a PMOS that constitutes a semiconductor integral circuit that operates with a low voltage is set smaller than the absolute value of the threshold value of a PMOS that constitutes a semiconductor integral circuit that operates with a high voltage. In the case of an NMOS transistor, the threshold value is positive. Therefore, the threshold value of an NMOS transistor that constitutes a semiconductor integral circuit that operates with a low voltage is set smaller than the threshold value of an NMOS transistor that constitutes a semiconductor integral circuit that operates with a high voltage.

In a semiconductor integral circuit that operates with a low voltage having PMOS transistors and NMOS transistors, the threshold values of the PMOS transistors are large and the threshold values of the NMOS transistors are small. Therefore, in such a semiconductor integral circuit, the leak current of the transistor increases, and the through current of an inverter or the like increases.

SUMMARY OF THE INVENTION

Given these problems, in a semiconductor integral circuit that operates with a low voltage having PMOS transistors and NMOS transistors, it is an object of the present invention to reduce the leak current of the transistors and the through current of the inverters.

To achieve the above-stated objectives, a semiconductor integral circuit according to the present invention has an analog circuit which changes linearly the voltage of an input signal and causes the amount of a current flowing through the analog circuit to change in accordance with the change in the voltage of the input signal. This semiconductor integral circuit also has a logic circuit to which an input signal having a first or second voltage is input. This logic circuit outputs an output signal having the first or second voltage in response to the first or second voltage of the input signal. The absolute value of the threshold value of each MOS transistor of the analog circuit is smaller than the absolute value of the threshold value of each MOS transistor of the logic circuit.

According to the present invention, in the semiconductor integral circuit, highly sensitive operation of the analog circuit is guaranteed, and the leak current and through current in the logic circuit can be reduced.

BRIEF DESCRIPTION OF THE DRAWINGS

FIG. 3(*b*) shows an exemplary diode-connected PMOS transistor according to the embodiment of the present invention.

DETAILED DESCRIPTION OF THE INVENTION

In what follows, embodiments of the present invention will be explained with reference to the attached drawings. The following explanation will be focused on parts that are directly related to the present invention. The other parts will not be explained.

Figure 1:
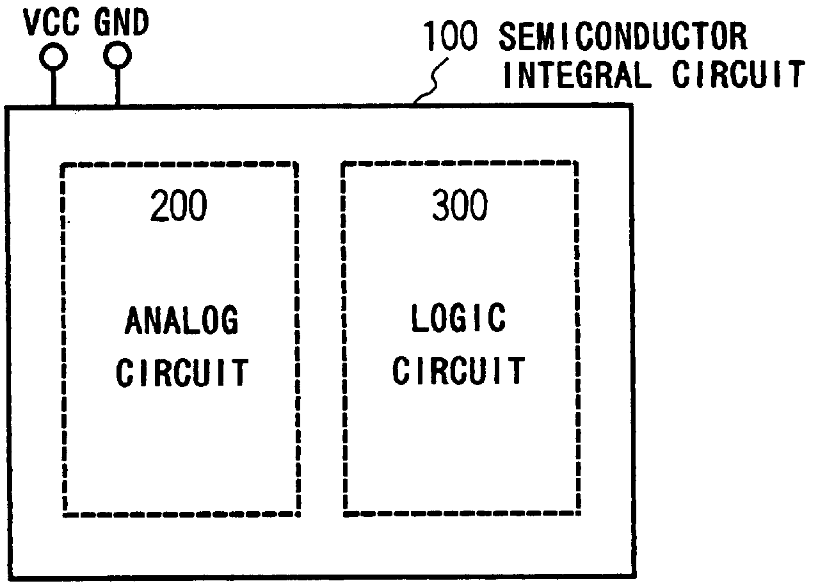
FIG. 1 is a block diagram showing a semiconductor integral circuit according to an embodiment of the present invention.

FIG. 1 shows a semiconductor integral circuit 100, and an analog circuit 200 and a logic circuit 300 that are formed in prescribed regions of this semiconductor integral circuit 100. The analog circuit 200 and the logic circuit 300 are electrically connected to each other. This semiconductor integral circuit 100 is driven by a power source voltage Vcc supplied from a power source and a ground voltage GND supplied from the ground.

In the analog circuit 200, the voltage of an input signal changes linearly and the amount of a current that flows inside the analog circuit 200 changes in accordance with the change in the voltage of the input signal.

An input signal having the power source voltage Vcc or the ground voltage GND is input to the logic circuit 300. In response to the voltage of this input signal, the logic circuit 300 outputs an output signal having the power source voltage Vcc or the ground voltage GND.

Figure 2:
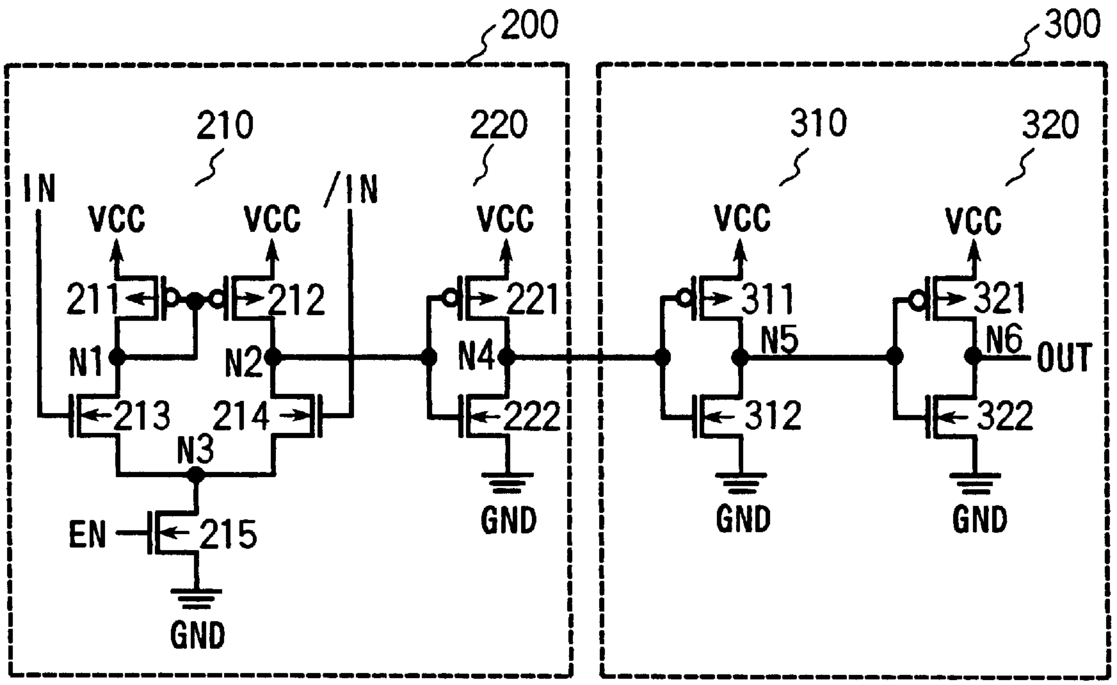
FIG. 2 is a partial circuit diagram showing an exemplary configuration of an analog circuit and a logic circuit according to the embodiment of the present invention.

FIG. 2 shows an exemplary configuration of a circuit that constitutes a portion of the analog circuit 200 and logic circuit 300.

As shown in FIG. 2, the analog circuit 200 has a differentiating amplifier circuit 210 and an analog output circuit 220 that outputs an output signal in response to a signal output from the differentiating amplifier circuit 210. The logic circuit 300 has a first inverter 310 which receives the output signal from the analog output circuit 220 and outputs an inverted signal and a second inverter 320 which receives the inverted signal from the first inverter 310 and outputs an inverted signal.

The differentiating amplifier circuit 210 has a first PMOS transistor 211, a second PMOS transistor 212, a first NMOS transistor 213, a second NMOS transistor 214, and a third NMOS transistor 215.

The first PMOS transistor 211 is connected between the power source Vcc and the node N1. The gate electrodes of the first PMOS transistor 211 are connected to the node N1 and the gate electrodes of the second PMOS transistor 212. The second PMOS transistor 212 is connected between the power source Vcc and the node N2. The first NMOS transistor 213 is connected between the node N1 and the node N3. An input signal IN is supplied to the gate electrodes of the first NMOS transistor 213. This input signal IN is an analog signal whose voltage level changes linearly.

The second NMOS transistor 214 is connected between the node N2 and the node N3. The inverted signal /IN of the input signal IN is supplied to the gate electrodes of the second NMOS transistor 214.

The third NMOS transistor 215 is connected between the node N3 and the ground GND. A control signal EN is supplied to the gate electrodes of the third NMOS transistor 215. When this control signal EN becomes a high level signal (power source voltage level) and the third NMOS transistor 215 is turned on, the differentiating amplifier circuit 210 is activated.

The analog output circuit 220 is constituted of a PMOS transistor 221 and an NMOS transistor 222. The PMOS transistor 221 is connected between the power source Vcc and the output node N4. The NMOS transistor 222 is connected between the output node N4 and the ground GND. The gate electrodes of the PMOS transistor 221 and NMOS transistor 222 are connected to the node N2.

The inverter 310 is constituted of a PMOS transistor 311 and an NMOS transistor 312. The PMOS transistor 311 is connected between the power source Vcc and the output node N5. The NMOS transistor 312 is connected between the output node N5 and the ground GND. The gate electrodes of the PMOS transistor 311 and NMOS transistor 312 are connected to the node N4.

The inverter 320 is constituted of a PMOS transistor 321 and an NMOS transistor 322. The PMOS transistor 321 is connected between the power source Vcc and output node N6. The NMOS transistor 322 is connected between the output node N6 and the ground GND. The gate electrodes of the PMOS transistor 321 and NMOS transistor 322 are connected to the node N5. The output node N6 is connected to the output terminal OUT of the logic circuit 300.

The operation of these circuits will now be explained in a comprehensive manner.

First, when the control signal EN is input to the third NMOS transistor 215, the third NMOS transistor 215 becomes conductive. When the input signal IN and the inverted signal /IN are input to the first NMOS transistor 213 and second NMOS transistor 214, respectively, a current flows through the differentiating amplifier circuit 210 in accordance with the voltage level of the input signal IN. The voltage at the node N2 also changes in accordance with the amount of this current.

When the voltage at this node N2 exceeds a prescribed level, the analog output circuit 220 outputs a low level (ground voltage level) signal. That is, the voltage at the node N4 becomes equal to the ground voltage level GND. On the other hand, when the voltage at this node N2 drops below another prescribed level, the analog output circuit 220 outputs a high level (power source voltage level) signal. That is, the voltage at the node N2 becomes equal to the power source voltage level Vcc.

The high level (power source voltage level) signal or the low level (ground voltage level) signal output from the analog output circuit 220 is input to the first stage inverter 310 of the logic circuit 300. The inverter 310 then inverts this input signal and outputs from the output node N5 the inverted high level (power source voltage level) signal or the inverted low level (ground voltage level) signal.

The inverted high level (power source voltage level) signal or the inverted low level (ground voltage level) signal output from the node N5 is input to the inverter 320. The inverter 320 then inverts the input signal and outputs from the output node N6 the inverted high level (power source voltage level) signal or the inverted low level (ground voltage level) signal.

In the above-provided explanation of the circuits and the operations of the circuits, exemplary analog circuits and logic circuits to which the present invention is applicable are described. Since the circuits used in the explanation are typical ones, it should be easy to understand the operations of these circuits.

In what follows, the characteristics of the present invention will be explained.

In the present invention, the absolute value of the threshold value of each of the MOS transistors that constitute the analog circuit 200 is set smaller than the absolute value of the threshold value of each of the MOS transistors that constitute the logic circuit 300.

In other words, if the threshold value of each of the PMOS transistors that constitute the analog circuit 200 is denoted by Vtp1, if the threshold value of each of the NMOS transistors that constitute the analog circuit 200 is denoted by Vtn1, if the threshold value of each of the PMOS transistors that constitute the logic circuit 300 is denoted by Vtp2, and if the threshold value of each of the NMOS transistors that constitute the logic circuit 300 is denoted by Vtn2, then these threshold values satisfy the following inequalities (1).

$$Vtn1<Vtn2,\ |vtp1|<|Vtp2| \qquad (1)$$

In other words, the threshold value of each of the NMOS transistors that constitute the analog circuit 200 is set smaller than that of each of the NMOS transistors that constitute the logic circuit 300. The threshold value of each of the PMOS transistors that constitute the analog circuit 200 is set larger than that of each of the PMOS transistors that constitute the logic circuit 300. Since the threshold values of PMOS transistors are negative, the absolute value of the threshold value of each of the PMOS transistors that constitute the analog circuit 200 is set smaller than that of each of the PMOS transistors that constitute the logic circuit 300.

Moreover, if the power source voltage is denoted by Vcc, then the following inequality (2) is also satisfied in the analog circuit 200.

$$Vtn1+|Vtp1|<Vcc \qquad (2)$$

In other words, the sum of the threshold value of any of the NMOS transistors and the absolute value of the threshold value of any of the PMOS transistors is smaller than the power source voltage Vcc.

Moreover, the following inequalities (3*a*), (3*b*) and (3*c*) are satisfied in the logic circuit 300.

$$Vcc<Vtn2+|Vtp2|<2Vcc \quad (3a)$$

$$Vtn2<Vcc \quad (3b)$$

$$|Vtp2|<Vcc \quad (3c)$$

In other words, in the logic circuit 300, the sum of the threshold value of any of the NMOS transistors and the absolute value of the threshold value of any of the PMOS transistors is set larger than the power source voltage Vcc and smaller than 2 Vcc, that is, twice the power source voltage. Moreover, both the threshold value of any of the NMOS transistors and the absolute value of the threshold value of any of the PMOS transistors are smaller than the power source voltage Vcc.

In this embodiment, the power source voltage Vcc and the ground voltage GND are set to 1.8V and 0V, respectively. The threshold value Vtp1 of any of the PMOS transistors that constitute the analog circuit 200 is set to a value between −0.5V and −0.7V. The threshold value Vtn1 of any of the NMOS transistors that constitute the analog circuit 200 is set to a value between 0.5V and 0.7V. The threshold value Vtp2 of any of the PMOS transistors that constitute the logic circuit 300 is set to a value between −0.7V and −1.5V. The threshold value Vtn2 of any of the NMOS transistors that constitute the logic circuit 300 is set to a value between 0.7V and 1.5V. All of these threshold values are set so as to satisfy the inequalities (1), (2), (3a), (3b), and (3c).

In practice, the design engineers can determine the threshold value of each of the transistors taking into consideration the relation between the above-provided inequalities and the power source voltage and the margin of circuit operation and the like.

By setting the threshold value of each of the transistors in the above-described manner, not only highly sensitive operation of the analog circuit 200 is guaranteed but also the leak current and the through current in the logic circuit can be reduced.

In other words, as the threshold voltage values of the transistors are made lower, the range of transition of the input signal, that is, the range of voltage variation of the input signal becomes narrow. Therefore, by setting the absolute value of the threshold value of each of the transistors that constitute the analog circuit smaller than the absolute value of the threshold value of each of the transistors that constitute the logic circuit, a circuit configuration capable of responding to a micro change in the input signal is realized.

On the other hand, if transistors having a small threshold value are installed in the logic circuit also as in the case of the conventional circuit, the leak current in each of the transistors increases and the through current in each of the inverters increases. Therefore, the absolute value of the threshold value of each of the transistors that constitute the logic circuit is set larger than the absolute value of the threshold value of each of the transistors that constitute the analog circuit. Hence, the leak current in each of the transistors and the through current in each of the inverters can be reduced inside the logic circuit.

The present invention solves the mutually compromising problems of improving the operation sensitivity of the analog circuit and reducing the leak current and the through current in the logic circuit. Therefore, the power consumption of the semiconductor integral circuit can be reduced while improving the sensitivity of the semiconductor integral circuit.

In many cases, semiconductor integral circuits that operate with a low voltage are driven using cells such as batteries or the like as a power source. Therefore, being able to reduce the power consumption of the semiconductor integral circuit is a very significant advantage. In other words, the present invention extends the life of the cells that drive the semiconductor integral circuits.

In the above-explained embodiment, a differentiating amplifier circuit is used as the analog circuit and an inverter circuit is used as the logic circuit. However, the range of technical applications of the present invention is not limited to these circuits.

Any circuit may be used for the analog circuit provided that the circuit changes linearly the voltage of an input signal and that the circuit causes the amount of the current flowing through the circuit to change in accordance with the change in the voltage of the input signal. Various configurations can be considered for the analog circuit such as a diode-connected MOS transistor, a charge pump circuit, a bias voltage generator circuit, an AD converter, and the like. Moreover, various kinds of specific configurations can be selected for each of these circuits.

Figure 3:
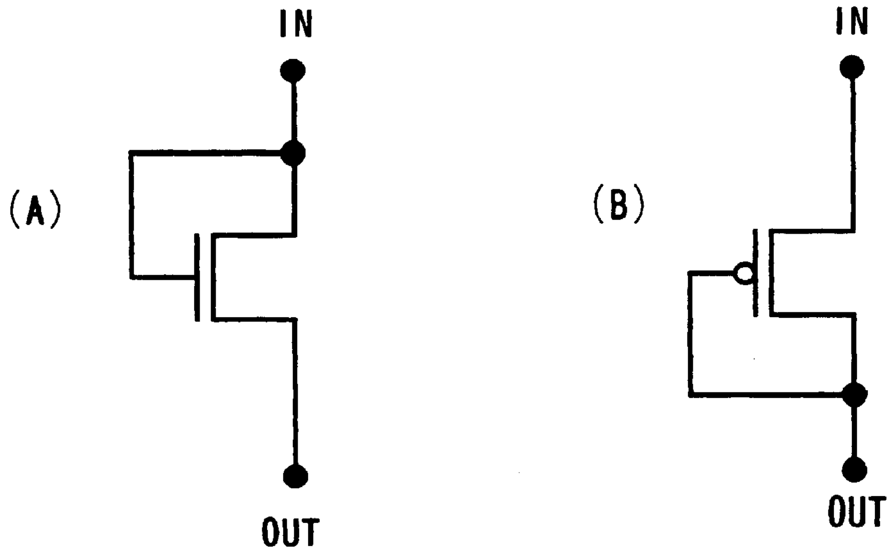
FIG. 3(*a*) shows an exemplary diode-connected NMOS transistor according to the embodiment of the present invention.

FIG. 3(*a*) shows an exemplary diode-connected NMOS transistor. FIG. 3(*b*) shows an exemplary diode-connected PMOS transistor. In this case, the amount of a current flowing through the transistor changes in accordance with the change in the voltage of the input signal IN. The output is then supplied to the output terminal OUT in accordance with the change in the amount of the current flowing through the transistor.

Figure 4:
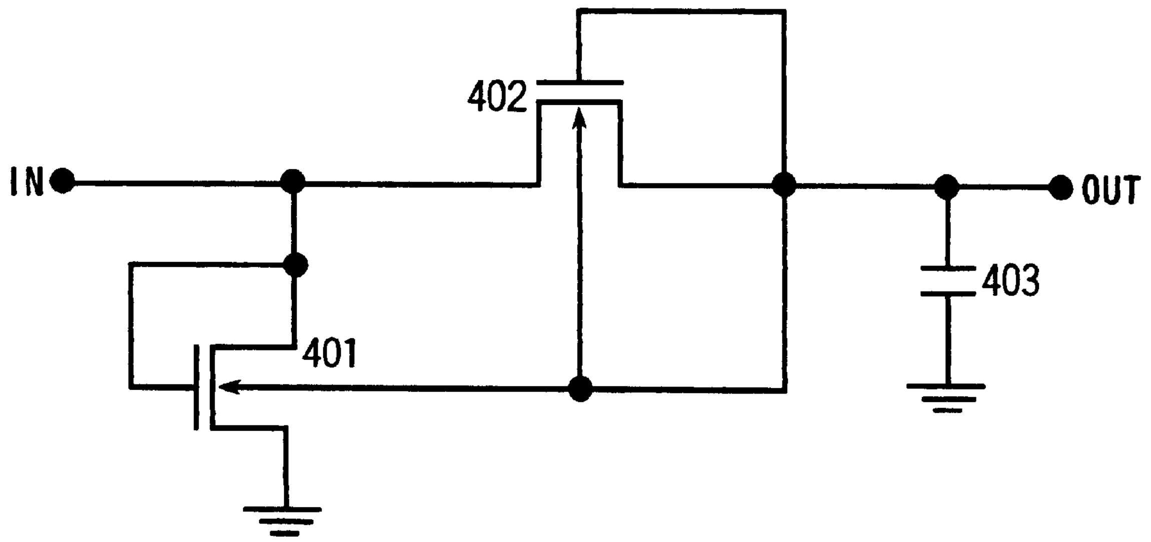
FIG. 4 shows an exemplary configuration of a charge pump circuit according to the embodiment of the present invention.

FIG. 4 shows an exemplary configuration of a charge pump circuit. This charge pump circuit has NMOS transistors 401 and 402, and a capacitor 403.

An input signal is supplied to one electrode of the NMOS 401, and the ground voltage is supplied to the other electrode of the NMOS 401. The one electrode of the NMOS 401 is connected to the gate electrode of the NMOS 401. The input signal is also supplied to one electrode of the NMOS 402, and the other electrode of the NMOS 402 is connected to the capacitor 403 and the output terminal OUT. The other electrode of the NMOS 402 is connected to the gate electrode of the NMOS 402.

In this charge pump circuit also, the amount of the current that flows through each of the transistors changes in accordance with the change in the voltage of the input signal IN. The voltage is charged in accordance with the change in the amount of the current that flows through each of the transistors and the output is supplied to the output terminal OUT.

Figure 5:
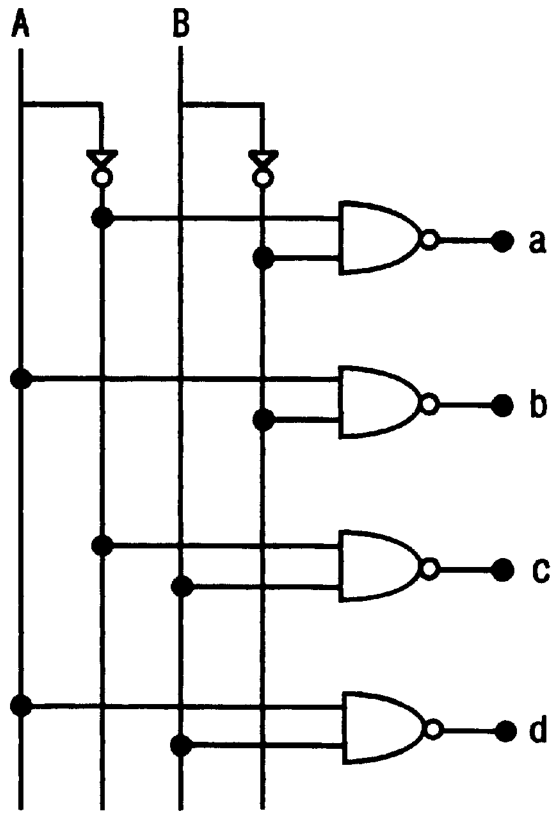
FIG. 5 shows an exemplary configuration of a decoder circuit as the logic circuit according to the embodiment of the present invention.
Figure 6:
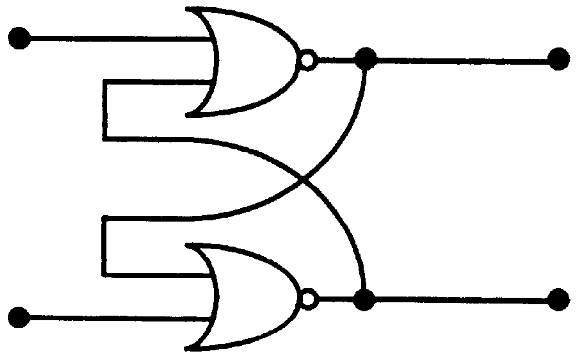
FIG. 6 shows an exemplary configuration of a counter circuit as the logic circuit according to the embodiment of the present invention.

Any circuit may be used for the logic circuit 300 provided that an input signal having the power source voltage or the ground voltage is input to the circuit and that the circuit outputs an output signal having the power source voltage or the ground voltage in response to the voltage of the input signal. Various configurations can be considered for the logic circuit, such as an inverter, a NOR circuit, an NAND circuit, a decoder circuit (an exemplary decoder circuit is shown in FIG. 5), a flip flop circuit (an exemplary flip flop circuit is shown in FIG. 6), a counter circuit, an oscillator circuit, and the like. Moreover, various kinds of specific configurations can be selected for each of these circuits.

Methods for setting the threshold values of MOS transistors in the above-described manner will now be explained. In other words, methods for setting the absolute value of each of the transistors of the analog circuit smaller than the absolute value of each of the transistors of the logic circuit will be explained.

Figure 7:
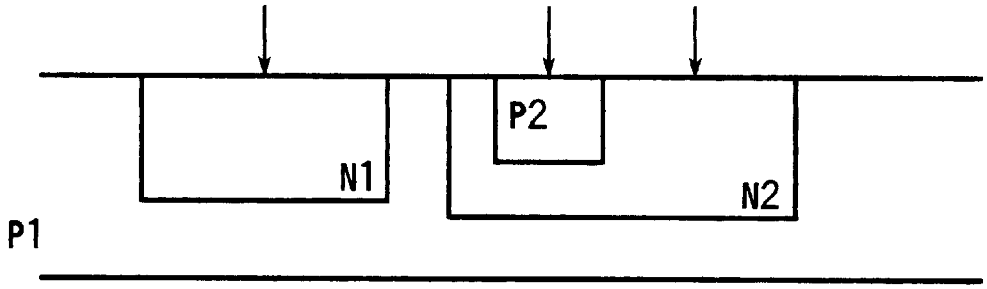
FIG. 7 shows a first method for setting the absolute value of each of the transistors of the analog circuit smaller than the absolute value of each of the transistors of the logic circuit.

First, with reference to FIG. 7, a method for forming two N-type wells in a P-type semiconductor substrate and a P-type well in one of the two N-type wells will be explained. In this case, ions are injected into each well so as to adjust the concentration in the well in forming the well.

To be more specific, boron ions of prescribed concentration are injected into the P-type well P2 so that the concentration in the P-type well P2 will be higher than that in the P-type semiconductor substrate P1. As a result, the threshold value of an NMOS transistor to be formed later inside the P-type well P2 will be increased. Thus, NMOS transistors of the analog circuit are formed in the P-type semiconductor substrate P1, and NMOS transistors of the logic circuit are formed in the P-type well P2.

Moreover, phosphorus ions having a first prescribed concentration are injected into the N-type well N1 and phosphorus ions having a second prescribed concentration are injected into the N-type well N2 so that the concentration in the N-type well N2 will be higher than that in the N-type well N1. As a result, the threshold value of a PMOS transistor to be formed later inside the N-type well N2 will be increased. Thus, PMOS transistors of the analog circuit are formed in the N-type well N1, and PMOS transistors of the logic circuit are formed in the N-type well N2.

Figure 8:
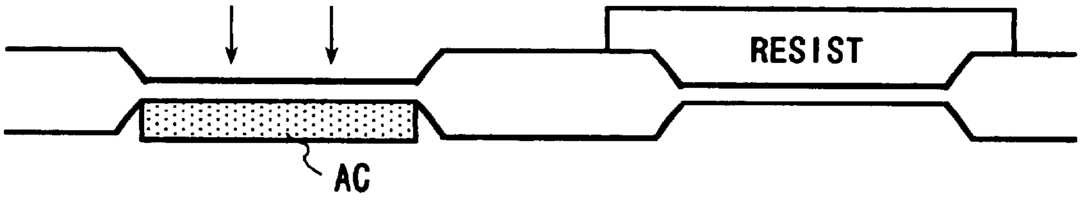
FIG. 8 shows a second method for setting the absolute value of each of the transistors of the analog circuit smaller than the absolute value of each of the transistors of the logic circuit.

FIG. 8 shows a second method for setting the absolute value of each of the transistors of the analog circuit smaller than the absolute value of each of the transistors of the logic circuit. In this second method, a field oxide film is first formed as shown in FIG. 8, and then ions are injected into an active region AC in which a transistor is to be formed.

To be more specific, after the field oxide film is formed, all the regions but the predetermined active region AC are covered with a resist, and then ions are injected into the active region AC. In this case, the threshold value of an NMOS transistor to be formed later will be decreased if phosphorus ions are injected into a region in which the NMOS transistor is to be formed. The threshold value of the NMOS to be formed later will be increased if boron ions are injected into the region. Similarly, the absolute value of the threshold value of a PMOS to be formed later will be increased if phosphorus ions are injected into a region in which the PMOS transistor is to be formed. The absolute value of the threshold value of the PMOS to be formed later will be decreased if boron ions are injected into the region.

Figure 9:
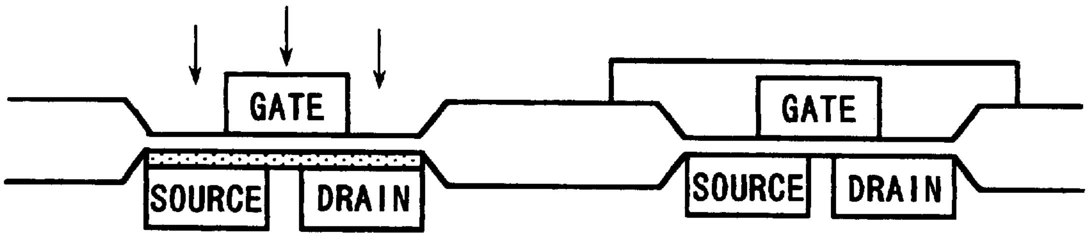
FIG. 9 shows a third method for setting the absolute value of each of the transistors of the analog circuit smaller than the absolute value of each of the transistors of the logic circuit.

FIG. 9 shows a third method for setting the absolute value of each of the transistors of the analog circuit smaller than the absolute value of each of the transistors of the logic circuit. In this third method, gate electrodes are first formed, and then ions are injected into a predetermined active region from above the gate electrodes.

In these methods, the design engineers can determine what ions to be injected and the concentration of the ions, while taking into consideration the relation between the above equations and the power source voltage, the margin of circuit operation, and the like.

Figure 10:
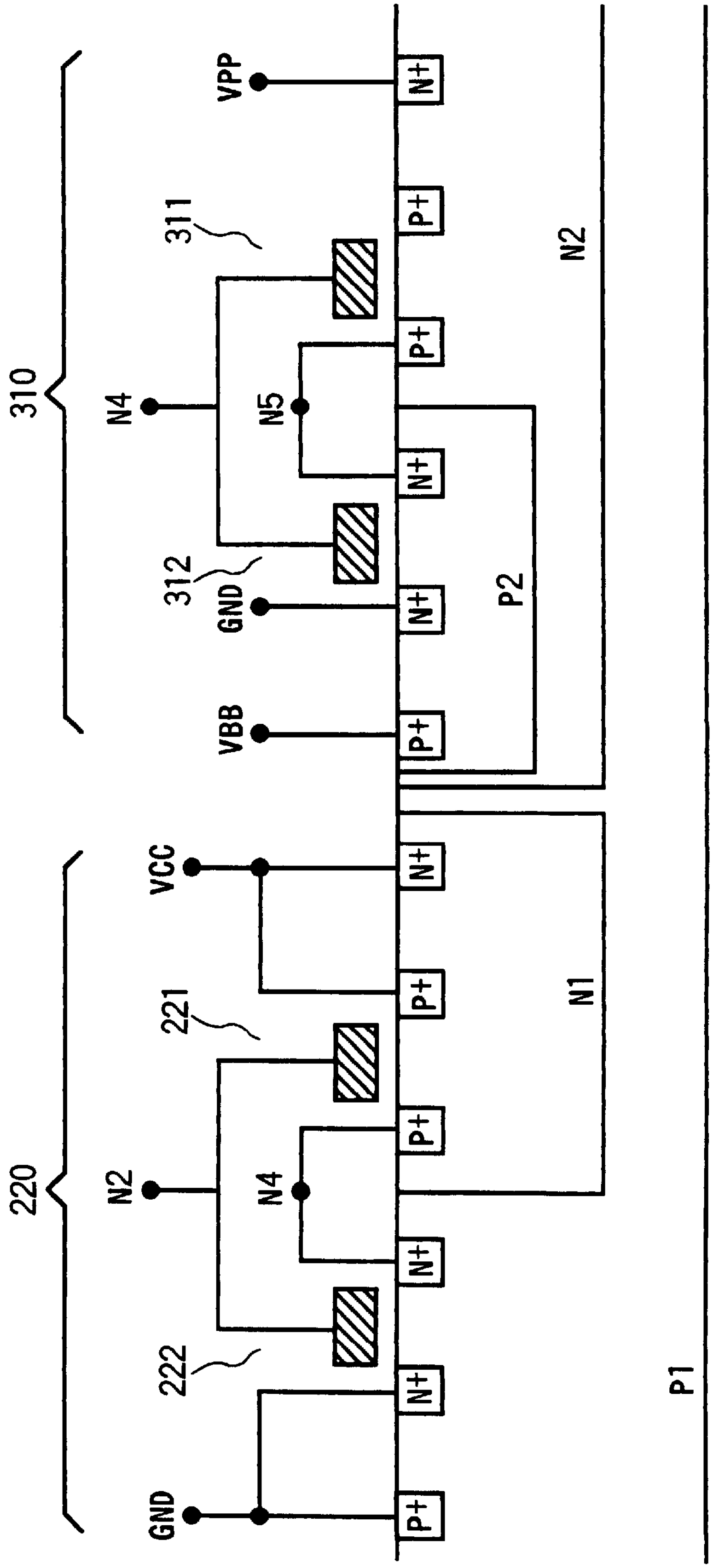
FIG. 10 is a partial cross sectional view for explaining another embodiment of the present invention.

Next, another embodiment of the present invention will be explained with reference to FIG. 10. In the example shown in FIG. 7, the threshold value of each of the MOS transistors to be formed later is adjusted by injecting ions in forming the wells. In contrast, in the embodiment to be shown, the threshold value of each of the MOS transistors is adjusted by a bias voltage to be supplied to the substrate or well (sometimes wells are collectively referred to as substrates also) in which the MOS transistor is formed. This embodiment will be explained using the analog output circuit 220 in the analog circuit 200 and the inverter 310 in the logic circuit 300. FIG. 10 is a cross sectional view of these circuits. In FIG. 10, the "$N^+$" indicate regions in which an N-type concentration is high and the "$P^+$" indicate regions in which a P-type concentration is high.

The NMOS transistor 222 of the analog output circuit 220 is formed in the P-type semiconductor substrate P1, and the PMOS transistor 221 of the analog output circuit 220 is formed in the N-type well N1.

The NMOS transistor 312 of the logic circuit 310 is formed in the P-type semiconductor substrate P2, and the PMOS transistor 311 of the logic circuit 310 is formed in the N-type well N2.

The characteristic of this embodiment is that the P-type well P2 is biased with a bias voltage VBB that is sufficiently lower than the ground voltage GND, and that the N-type well N2 is biased with a bias voltage VBB that is sufficiently higher than the power source voltage Vcc.

The P-type semiconductor substrate P1 is biased with the ground voltage GND and the N-type well N1 is biased with the power source voltage Vcc. However, the present embodiment is not limited to this configuration.

In other words, any other setup is admissible provided that the bias voltage for the substrate or each well is set to satisfy the following inequalities. Denoting the bias voltages for the P-type semiconductor substrate P1, P-type well P2, N-type well N1, and N-type well N2 by VBB1, VBB2, VPP1, and VPP2, respectively, the following inequalities are satisfied in the present embodiment.

$$VBB1 \geqq GND,\ VPP1 \leqq Vcc,\ VBB2 \leqq GND,\ VPP2 \geqq Vcc \quad (4)$$

By setting the bias voltages in this way, the threshold value of each transistor can be easily controlled. That is, since a bias supply circuit is installed to each substrate, the ion injection process in the above-described manufacture process can be simplified.

Such bias voltages VBB1, VBB2, VPP1, and VPP2 can be supplied using a conventional bias supply circuit. For example, the bias supply circuits disclosed in the Japanese Patent Application Laid-Open No. H2-350, the Japanese Patent Application Laid-Open No. 62-178013, and the Japanese Patent Application Laid-Open No. 61-64148 can be used.

By setting the threshold value of each transistor in this manner, highly sensitive operation is guaranteed for the analog circuit, and the leak current and through current in the logic circuit can be reduced.

According to the present invention, highly sensitive operation is guaranteed for the analog circuit, and the leak current and through current in the logic circuit can be reduced. If the present invention is applied to low voltage operation semiconductor integral circuits that are driven using cells such as batteries or the like as a power source, the life of the cells can be extended.

So far, the present invention has been explained using embodiments. However, the range of technical applications of the present invention is not limited to these embodiments. Other variations and modifications of the above-described embodiments should be evident to those skilled in the art. Accordingly, it is intended that such alterations and modifications be included within the scope and spirit of the present invention as defined by the following claims.

What is claimed is:

1. A semiconductor device comprising:

an analog circuit comprised of a plurality of first n channel type MOS transistors and a plurality of first p channel type MOS transistors, wherein said analog circuit receives an analog input signal and outputs a first logic signal having a first or a second voltage by changing an amount of current flowing therein in response to a voltage of the analog input signal; and a logic circuit connected to the analog circuit and comprised of a plurality of second n channel type MOS transistors and plurality of second p channel type MOS transistors, wherein said logic circuit receives the first logic signal from the analog circuit and outputs a second logic signal having the first or second voltage in response to the first logic signal, wherein absolute threshold voltages of said first n and p channel type MOS transistors are smaller than absolute threshold voltages of said second n and p channel type MOS transistors, and wherein Vtn1+|Vtp1|<Vcc, Vcc<Vtn2+|Vtp2|<2Vcc, Vtn2<Vcc, and |Vtp2|<Vcc, where Vtn1 denotes a threshold voltage of said first n channel type MOS transistors, Vtp1 denotes a threshold voltage of said first p channel type MOS transistors, Vtn2 denotes a threshold voltage of said second n channel type MOS transistor, Vtp2 denotes a threshold voltage of said second p channel type MOS transistor, and Vcc and GND denotes said first voltage and said second voltage and said second voltage, respectively.

2. A semiconductor device as claimed in claim 1, wherein said threshold of each of said plurality of first and second n and p channel type transistors is defined by an amount of ions injected into a semiconductor substrate in which each of said plurality of first and second n and p channel type transistors is formed.

3. A semiconductor device as claimed in claim 1, wherein said first n channel type MOS transistors, said second n channel type MOS transistors, said first p channel type MOS transistors, and said second p channel type MOS transistors are formed in a first p type semiconductor substrate, a second p type semiconductor substrate, a first n type semiconductor substrate, and a second n type semiconductor substrate, respectively, and wherein said first p type semiconductor substrate is biased to a first bias voltage that is higher than a second bias voltage to which said second p type semiconductor substrate is biased, and wherein an absolute value of a third bias voltage to which said first n type semiconductor substrate is biased is smaller than an absolute value of a fourth bias voltage to which said second n type semiconductor substrate is biased.

4. A semiconductor integral circuit as claimed in claim 3, wherein VBB1≧GND, VPP1≦Vcc, VBB2≦GND, and VPP2≧Vcc, where VBB1, VBB2, VPP1, and VPP2 denote the first, second, third and fourth bias voltages, respectively, and where GND and Vcc denote ground and source voltages, respectively.

5. A semiconductor device driven by a first voltage and a second voltage, comprising:

an analog circuit comprised of a plurality of first n channel type MOS transistors and a plurality of first p channel type MOS transistors, wherein said analog circuit receives an analog input signal and outputs an analog output signal in response to a voltage of the analog input signal; and a logic circuit connected to the analog circuit and comprised of a plurality of second n channel type MOS transistors and a plurality of second p channel type MOS transistors, wherein said logic circuit receives a first logic signal having a first or second voltage and outputs a second logic signal having the first or second voltage in response to the first logic signal, wherein absolute threshold voltages of said first n and p channel type MOS transistors are smaller than absolute threshold voltages of said second n and p channel type MOS transistors, and wherein Vtn1+|Vtp1|<Vcc, Vcc<Vtn2+|Vtp2|<2Vcc, Vtn2<Vcc, and |Vtp2|<Vcc, where Vtn1 denotes a threshold voltage of said first n channel type MOS transistors, Vtp1 denotes a threshold voltage of said first p channel type MOS transistors, Vtn2 denotes a threshold voltage of said second n channel type MOS transistor, Vtp2 denotes a threshold voltage of said second p channel type MOS transistor, and Vcc and GND denote said first voltage and said second voltage, respectively.

6. A semiconductor device as claimed in claim 5, wherein said threshold of each of said plurality of first and second n and p channel type transistors is defined by an amount of ions injected into a semiconductor substrate in which each of said plurality of first and second n and p channel type transistors is formed.

7. A semiconductor device as claimed in claim 5, wherein said first n channel type MOS transistors, said second n channel type MOS transistors, said first p channel type MOS transistors, and said second p channel type MOS transistors are formed in a first p type semiconductor substrate, a second p type semiconductor substrate, a first n type semiconductor substrate, and a second n type semiconductor substrate, respectively, and wherein said first p type semiconductor substrate is biased to a first bias voltage that is higher than a second bias voltage to which said second p type semiconductor substrate is biased, and wherein an absolute value of a third bias voltage to which said first n type semiconductor substrate is biased is smaller than an absolute value of a fourth bias voltage to which said second n type semiconductor substrate is biased.

8. A semiconductor device as claimed in claim 7, wherein VBB1≧GND, VPP1≦Vcc, VBB2≦GND, and VPP2≧Vcc, where VBB1, VBB2, VPP1, and VPP2 denote the first, second, third and fourth bias voltages, respectively, and where GND and Vcc denote ground and source voltages, respectively.

* * * * *